United States Patent [19]

Usami et al.

[11] Patent Number: 5,196,786
[45] Date of Patent: Mar. 23, 1993

[54] METHOD FOR INSPECTING AN ELECTRONIC STATE OF A SURFACE OF A SEMICONDUCTOR SUBSTRATE AND AN APPARATUS THEREFOR

[75] Inventors: Akira Usami, Aichi; Kazunori Matsuki; Tsutomu Takeuchi, both of Kyoto, all of Japan

[73] Assignee: Dainippon Screen Mfg. Co., Ltd., Japan

[21] Appl. No.: 675,796

[22] Filed: Mar. 27, 1991

[30] Foreign Application Priority Data

Mar. 27, 1990 [JP] Japan .................................. 2-80386

[51] Int. Cl.⁵ .................... G01R 31/26; G01R 27/06
[52] U.S. Cl. ................................ 324/158 R; 324/73.1; 324/158 D; 324/642
[58] Field of Search .............. 324/73.1, 158 R, 158 D, 324/642, 719, 501, 71.3, 71.5, 702, 95; 250/310, 311, 492.2; 437/8

[56] References Cited

U.S. PATENT DOCUMENTS

| | | | |
|---|---|---|---|
| 3,939,415 | 2/1976 | Terasawa | 324/642 |
| 4,329,686 | 5/1982 | Mourou | 324/95 |
| 4,605,893 | 8/1986 | Braslau | 324/158 P |
| 4,949,034 | 8/1990 | Imura et al. | 324/158 R |
| 5,081,414 | 1/1992 | Kusama et al. | 324/642 |

Primary Examiner—Vinh Nguyen
Attorney, Agent, or Firm—Ostrolenk, Faber, Gerb & Soffen

[57] ABSTRACT

Applying a first light ($\lambda = 950$ nm) to a Si wafer to generate electron-hole pairs, a microwave is emitted to the Si wafer and the amount of reflection of the microwave is measured. In like manner, applying a second light ($\lambda = 633$ nm), the amount of reflection of the microwave is measured. The two amounts are normalized by intensities of the lights respectively. In order to cancel an error resulting from geometrical position between a measuring apparatus and the Si wafer, a normalized finite difference is calculated through subtraction between the normalized amounts. The difference may be obtained by another calculation so that it stays in a specified width when a uniformly doped Si wafer is measured.

12 Claims, 14 Drawing Sheets

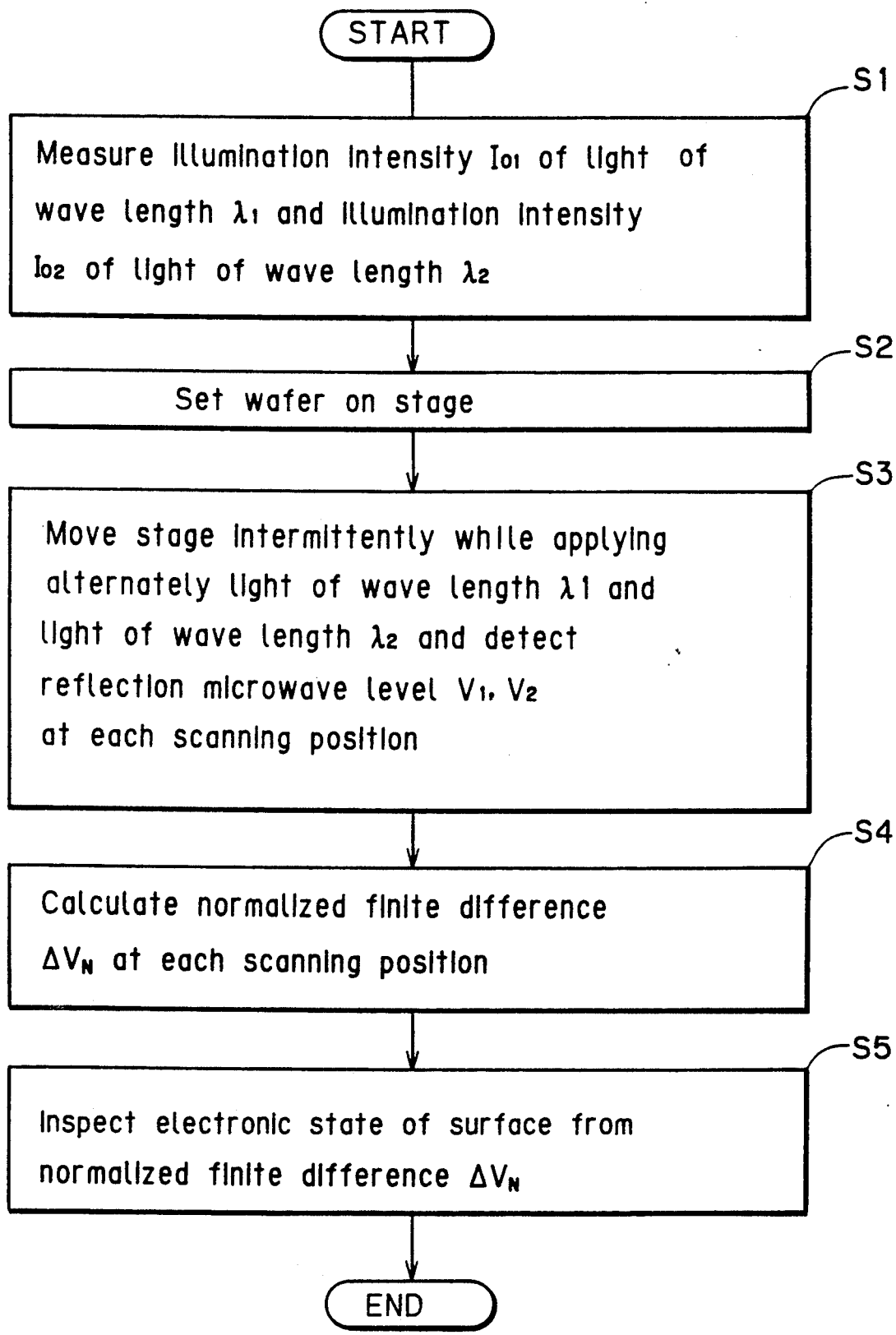

FIG.5A
FIG.5B

METHOD FOR INSPECTING AN ELECTRONIC STATE OF A SURFACE OF A SEMICONDUCTOR SUBSTRATE AND AN APPARATUS THEREFOR

BACKGROUND OF THE INVENTION

1. Field of the Invention

This invention relates to a method for inspection of an electronic state of a surface of a semiconductor substrate and an apparatus therefor, and more particularly relates to a technique of inspecting an electronic state of a surface of the substrate by generating electron hole pairs thereon and measuring absorption of electromagnetic wave thereof. The term "electronic state" as used herein and in the appended claims means the recombination rate of excess carriers or the concentration of recombination centers in the vicinity of the surface of the semiconductor substrate.

2. Description of Prior Art

In the manufacture of integrated circuits, as well known, impurity ions are injected or diffused into the main surface of a semiconductor substrate, and then various film structures are formed thereon. To determine whether this process has been accurately carried out, it is necessary to inspect the electronic state of the surface of the semiconductor substrate.

One inspection technique, an electromagnetic and non-contact evaluation technique, is disclosed in JP, A, 22034/1986. In this technique, electron-hole pairs are generated by light emission to the semiconductor substrate. The electrons and holes, thus generated, are excess carriers, and are recombined by recombination centers distributed on the surface of the substrate, and after a lapse of a period of time longer than the lifetime of the carriers, reach a stationary state which is caused by the difference between a quantity of the carriers generated by light excitation and that lost by recombination. In the above-mentioned technique, the substrate having reached the stationary state is irradiated with microwave. Even if the light irradiation is not conducted, the carriers in a thermal equilibrium state respond to the microwave to cause absorption thereof and emission of secondary electromagnetic waves (hereinafter these phenomena are generally called "absorption"), but if light irradiation is conducted, excess carriers generated thereby also cause absorption of microwave so that a quantitative response of the substrate to the microwave occurs. In other words, the variable amount of microwave absorption by the substrate reaches a value corresponding to the total number of excess carriers existing at the current point. In the above conventional technique, therefore, a measurement is conducted with reference to the variable amount of reflection which is complementary to the variable amount of microwave absorption. The rate of re-combination of excess carriers or concentration of the re-combination centers is indirectly measured to determine the amount of ion dose on the surface of the substate. This inspection method is generally called "microwave reflection method (in stationary state)".

In the above inspection method, the surface of the substrate is successively scanned while moving the substrate relative to the measuring apparatus, such as a microwave generator, microwave detector etc., in order to inspect the electronic state of the surface of the substrate at various points of the surface. During movement of the substrate relative to the measuring apparatus, the distance between the measuring apparatus and the surface of the substrate is varied minutely, thereby causing variation of the measuring conditions such as microwave output impedance from the side of the microwave generator and the like. The principle of the above measurement is based on an assumption that the surface of the substrate is evenly extended. In practice, however, the substrate has at the ends thereof uneven parts, such as edges or orientation flats, etc., which cause deviation of the measurement results.

Thus, the measurement conditions are varied according to the relation of geometrical position between the measurement apparatus and the substrate to cause errors in the measurement data. It is desired to improve the accuracy of the inspection of the electronic state of the substrate surface by preventing the effect of measurement errors as mentioned above.

SUMMARY OF THE INVENTION

A device according to the present invention is employable for inspecting an electronic state of a surface of a semiconductor substrate. It comprises electromagnetic wave emitting means, first and second light emitting means, light selecting means, electromagnetic wave detecting means, data generating means and calculator means.

The electromagnetic wave emitting means emit a first electromagnetic wave to a surface of the semiconductor substrate, wherein the first electromagnetic wave has an energy smaller than a minimum energy required for generating an electron-hole pair in the semiconductor substrate.

The first and second light emitting means emit a first light and a second light respectively to the surface of the semiconductor substrate. The first light has an energy larger than the minimum energy, and the second light has another energy larger than the minimum energy.

The light selecting means alternately select one of the first and second lights and lead a selected light to a surface of the semiconductor substrate.

The electromagnetic wave detecting means detect a second electromagnetic wave which is emitted from the semiconductor substrate in response to the first electromagnetic wave when the surface is exposed to the selected light and generate an electric signal representing an intensity of said second electromagnetic wave.

The data generating means generate first and second data values representing the electric signal in first and second time periods during which the first and second lights are selected by the light selecting means, respectively.

The calculator means substitute the first and second data values for variables included in a predetermined mathematical function of a finite difference type to thereby obtain a function value which is employable in inspecting an electronic state of the surface of the semiconductor substrate.

According to this invention, the error caused by the variation of the relation of geometrical position between the measuring apparatus and the substrate is commonly included in the first and second level data. The error is compensated by assigning the data to finite difference type function.

Further, according to the invention, the term of "reflection" includes not only direct reflection but also emission of secondary electromagnetic wave from the substrate. The term "finite difference-type function"

means a function in general derived from difference between variables each of which has been converted with the same form including not only a direct difference between two variables but also function forms determing difference of power or logarithm thereof (namely, equivalently derived ratio of two variables).

Accordingly, the principal object of the invention is to provide an inspection method and an apparatus therefor which are capable of effecting high accuracy inspection of an electronic state of a substrate surface in a method for measuring transmission of microwave, even if measurement conditions, such as relation of geometrical position between the measurement apparatus and the substrate, are varied. For example, the microwave reflection method in the stationary state aforementioned is included in the above microwave transmission measuring method which is based on the same principle as that of the former.

These and other objects, features, aspects and advantages of the present invention will become more apparent from the following detailed description of the present invention when taken in conjunction with the accompanying drawings.

BRIEF DESCRIPTION OF DRAWINGS

FIG. 4 is a flow chart showing operation of the apparatus of the invention, FIG. 5A and FIG. 5B are timing diagrams showing operation of detecting reflection level of microwave.

DESCRIPTION OF THE PREFERRED EMBODIMENTS

A. Constitution of Apparatus and Outline of Operations Thereof

Figure 1:
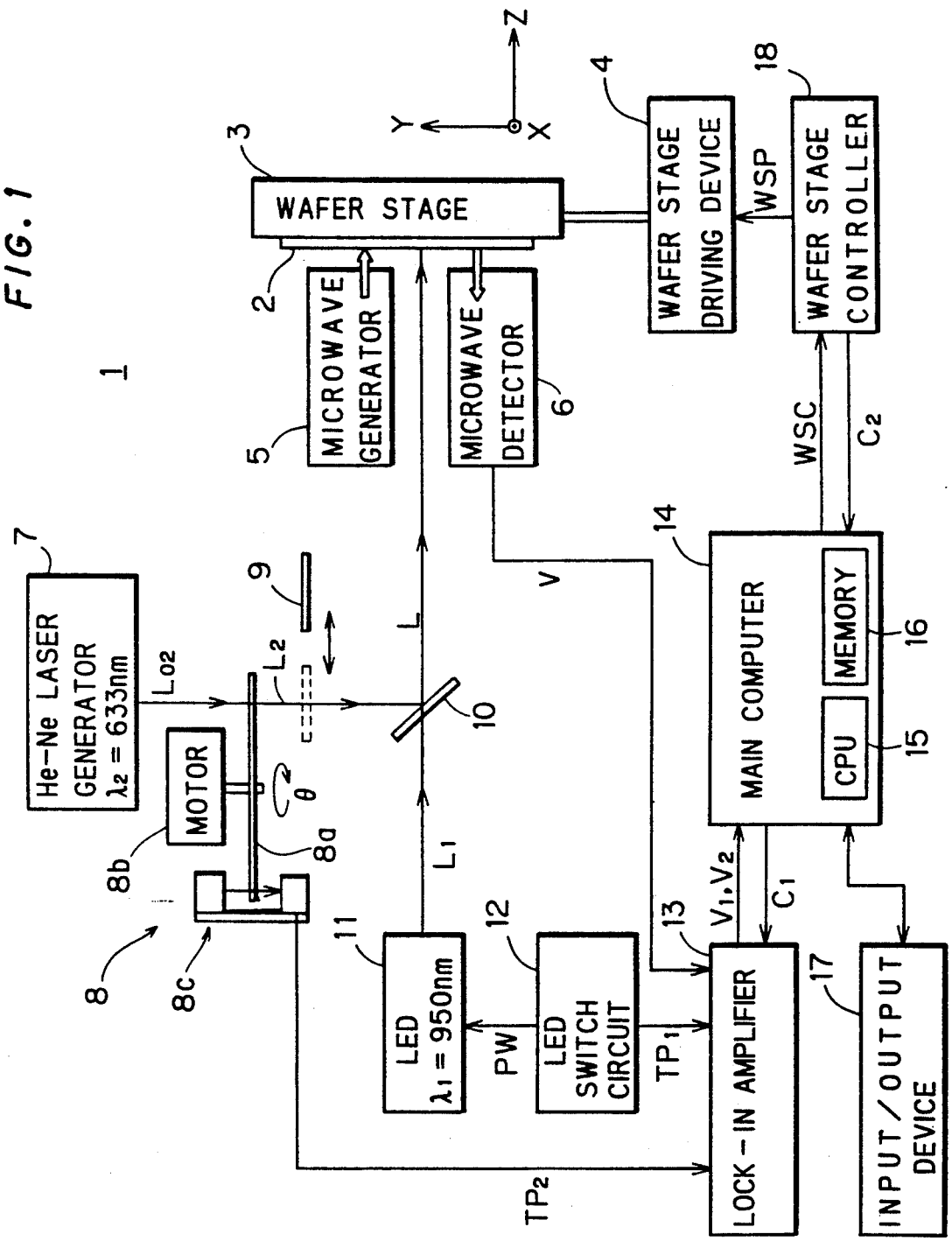
FIG. 1 is a block diagram illustrating certain principles apparatus of an of the invention, for inspecting an electronic state of a surface status of a semiconductor substrate.

FIG. 1 is a block diagram of an apparatus 1 for inspecting an electronic state of a substrate surface, such as the surface of a semiconductor wafer 2, in accordance with certain principles of the invention. The semi-conductor wafer 2 is supported on a wafer stage 3. The wafer stage 3 is intermittently moved in an X-Y two dimensional plane by a wafer stage driving device 4. At the position opposite to the main surface of wafer 2, a microwave generator 5 and a microwave detector 6 are arranged parallel with each other. The generator 5 is positioned so as to introduce microwaves of 9-10 GHz generated by a gun diode through a waveguide near the wafer 2, and allowed to irradiate the main surface of wafer 2 with the microwaves. The detector 6 detects the level of microwaves reflected from the wafer 2 with a detection diode. Excess carriers are generated on the surface of wafer 2 by light excitation as described below. The level of the reflected microwaves has a value corresponding to the number of excess carriers since a part of the incident microwaves to the wafer 2 is absorbed by these excess carriers.

In order to conduct the above-mentioned light excitation, the apparatus 1 is provided with two light sources. The first light source is a light emission diode (LED) 11. This LED 11 emits a recurring first pulse light $L_1$ of $\lambda_1 = 950$ nm in wave length and 5 ms in pulse width by providing a recurring pulse signal PW from a LED switch circuit 12. The first pulse light $L_1$ is emitted toward a dichroic mirror 10.

The second light source is a He-Ne laser generator 7 which emits laser light $L_{02}$ of $\lambda_2 = 633$ nm in wave length. The He-Ne laser generator 7 is a laser light source of the continuous-generating type and is provided with a chopper 8 in order to convert the output $L_{02}$ to recurring pulse light $L_2$. The chopper 8 generates the second pulse light $L_2$ of 5 ms in pulse width by placing a light screening disk $8a$ having a slit arrangement in the path of the output $L_{02}$ and rotating the screening disk 8 uniformly in the $\theta$-direction with a motor $8b$ thereby periodically dividing out the laser light $L_{02}$. The timing of dividing-out of the laser light is detected by a photosensor $8c$ having emission part and reception part to produce timing reference signal $TP_2$.

A light screening shutter 9 is positioned adjacent to the path of the second pulse $L_2$. When the shutter 9 is moved by a shutter driving device, not shown in the drawing, to the position shown by dashed lines, the progress of the second pulse light $L_2$ is inhibited, and when the shutter 9 is returned to the position of solid line, the second pulse light $L_2$ reaches the dichroic mirror 10.

The dichroic mirror 10 has a mirror surface which reflects light of short wave length and transmits light of a long wave length. The recurring pulse signal PW from the LED switching circuit 12 is generated only when the shutter 9 is at the position of the dashed lines. Accordingly, the pulse light L entering from the dichroic mirror 10 to the wafer 2 is $L = L_2$ when the shutter 9 is at the solid line position, and $L = L_1$ when the shutter 9 is at the dashed lines position.

Therefore, a mechanism for switching the incident light to the wafer 2 is formed by the combination of the shutter 9 and the dichroic mirror 10. The pulse light L enters at right angles to the main surface of the wafer 2, passing through a space formed between the microwave generator 5 and the microwave detector 6.

The detection output V of the microwave detector 6 is supplied to a lock-in amplifier 13, along with the timing reference signal $TP_2$ from the photosensor $8c$ and as the timing reference signal $TP_1$ from the LED switch circuit 12. The pulse timing signal $TP_1$ is a timing signal substantially the same as the recurring pulse signal PW sent to LED 11. When incident pulse light L is the first pulse light $L_1$, the first timing reference signal $TP_1$ is used for action timing control in the lock-in amplifier 13, and when the incident pulse light L is the second pulse light L₂, the second timing reference signal TP₂ is used therefor.

The lock-in amplifier 13, which receives action timing control, amplifies the microwave detection output V while conducting phase detection and smoothening. The lock-in amplifier output V₁ which occurs when L=L₁, and V₂ which occurs when L=L₂, are sent to a main computer 14 time serially. The computer 14, comprising CPU 15 and memory 16, performs an operation based on the signals V₁, V₂ as described below. The operation results are stored in the memory 16 or delivered to an input/output device 17 to provide an image on a display or a printout on a hard copy.

The main computer 14 also controls the lock-in amplifier 13 and the wafer stage controller 18 by respective signals C₁, WSC. The wafer stage controller 18 responds to this signal WSC to provide its driving power WSP to a wafer stage driving device 4. A signal C₂ for detecting the stage driving status is fed back from the wafer stage controller 18 to the main computer 14.

Figure 2:
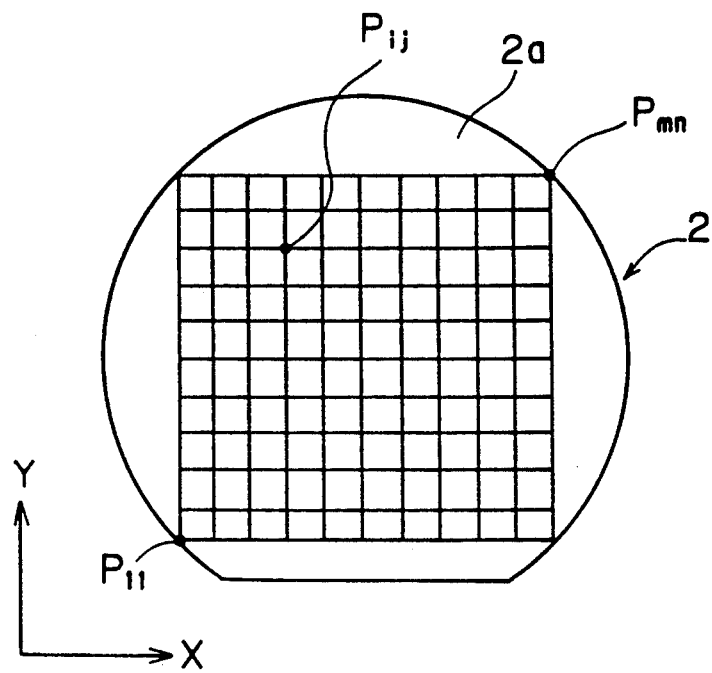
FIG. 2 is a view of scanning position on a semiconductor wafer.

Alternate switching of the pulse light $L_1$, $L_2$ and generation of signals $V_1$, $V_2$ is carried out when the wafer 2 is intermittently moved by the stage 3. As shown in FIG. 2, assumption being made that lattice point $P_{ij}$ (i=1−m, j=1−n) in a matrix form is, on the main surface 2a of the wafer 2, the stage 3 is moved intermittently so that the pulse light L enters sequentially to each of the lattice points $P_{ij}$ to generate signals $V_1$, $V_2$ and carry out operation based on them. Therefore, the data finally obtained is in a form of discrete two dimensional mapping.

B. Principle of Surface Status Evaluation

Before, a detailed description of the operations of the surface state inspecting apparatus 1, the principle of inspection carried out in the apparatus 1 will be first explained. Hereinafter, it is assumed that the wafer 2a is a silicon wafer and ion injection in an amount of low dose is carried out from the main surface 2a thereof.

As is well known, in a silicon single crystal, the energy gap $E_g$ is about 1.1 [eV] near room temperature (300K). Since this gap $E_g$ corresponds to about 1120 nm in wave length if converted to photon energy, electron-hole pairs can be produced in the vicinity of the surface by emitting light corresponding to wave length shorter than that of the gap $E_g$. As, these electron-hole pairs are recombined by recombination centers, such as lattice defects, damage or impurity atoms, they generate photons and disappear. Accordingly, excess carriers exist in the wafer in a number corresponding to the difference between the amount of excess carriers produced by light excitation and that lost by recombination. Since the rate of recombination of excess carriers varies with the concentration of the recombination centers, the number of excess carriers depends on the concentration of recombination centers in the vicinity of the surface of wafer 2.

On the other hand, when an electromagnetic wave having energy smaller than the above-mentioned energy gap $E_g$ (i.e. critical energy of generating electron-hole) is applied to the wafer 2, this electromagnetic wave is absorbed by the carriers in the wafer 2. The absorbed amount thereof is proportional to the total number of the carriers, and the total number of carriers is a sum of the number of carriers thermally excited corresponding to the temperature of wafer 2 and the number of carriers excited by light as above mentioned. Further, the amount of reflection of the above electromagnetic wave is the difference between the incident amount and the scattered amount such as the absorption amount, and, therefore, the change of reflection level of electromagnetic waves, in particular microwaves, by light application also corresponds to the total number of excess carriers.

From the above described facts, it is understood that the recombination rate of excess carriers or the concentration of recombination center in the vicinity of the surface of wafer 2 can be indirectly determined by detecting the variation of reflection level of electromagnetic waves from the wafer 2. In the example now considered, the concentration of recombination center relates to the amount of dose in the ion injection, and therefore, the surface state of wafer 2 injected with ions can be inspected by measuring the reflection level of electromagnetic wave.

Figure 3A:
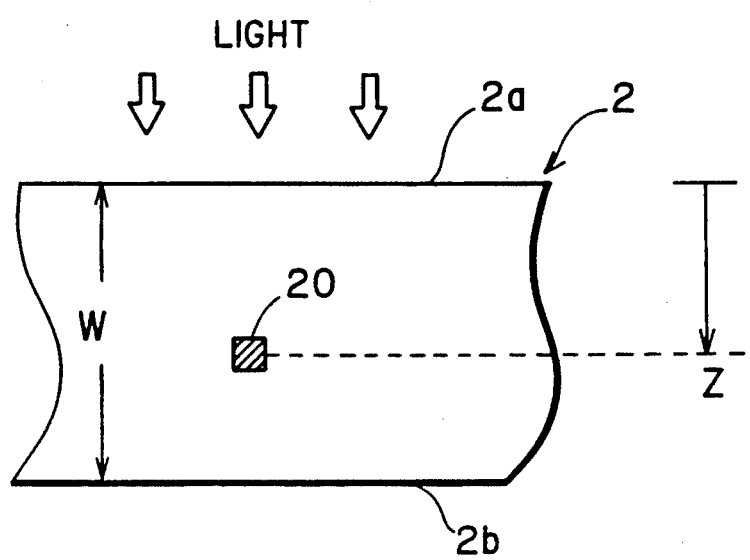
FIG. 3A is a diagrammatical sectional view of a wafer.

The depth of light transmission to the wafer 2 varies with the wave length L thereof, and the longer the wave length, the deeper the light transmission. To show the situation theoretically, reference is made to FIG. 3A which diagrammatically shows the cross section of wafer 2. In FIG. 3A, W indicates the thickness of wafer 2.

Firstly studied is a region 20 of unit volume which is positioned at a depth z from the main surface 2a of wafer 2. Since it is assumed that in the area remote from the side edge of wafer 2, the movement of carriers occurs only in the direction of the depth, the following analysis can be made according to one dimensional model in the z-direction.

To define a time variable t, a serial equation with reference to the number of excess carriers Δp (z,t) in the area 20 is as follows.

$$(\delta/\delta t)\Delta p(z, t) = -\Delta p(z, t)/\tau_b + D(\delta^2/\delta z^2)\Delta p(z, t) + G \cdot \exp(-\alpha z) \quad (1)$$

wherein,
$\tau_b$: recombination life time of bulk,
D: diffusion constant of carriers
$\alpha$: absorption coefficient of applied light
G: generation rate of carriers
and generation rate G of carriers is given by $$G = q\alpha(1-R_s)I_0 \quad (2)$$

wherein
q: yield of quantum
$R_s$: light reflectivity of silicon wafer
$I_0$: illumination degree of incident light The first term in the formula (1) indicates elimination of the excess carriers by recombination, the second term indicates diffusion thereof, and the third term corresponds to generation by light irradiation.

If the light applied to the wafer 2 is continuous light or pulse light having pulse width sufficiently longer than the life time of a small number of carriers, the system reaches a stationary state after a certain period of time from the start of light irradiation. At this stationary state, since Δp (z,t) loses time dependency, the following formula can be obtained by assigning zero to the left side of the formula (1) and writing Δp (z,t) to read Δp (z).

$$D(d^2/dz^2)\Delta p(z) - \Delta p(z)/\Delta_b + G \cdot \exp(-\alpha z) = 0 \quad (3)$$

General solution of the formula (3) is:

$$\Delta p(z) = K_1 \cdot \exp(-z/l_D) + K_2 \cdot \exp(z/l_D) + C \cdot \exp(-\alpha z) \quad (4)$$

wherein $$C = G/[D(\alpha^2 - 1/l_D^2)] \quad (5)$$

$$l_D = (D\tau_b)^{\frac{1}{2}} \quad (6)$$

$l_D$ corresponds to the diffusion length of the carrier.

The constants $K_1$, $K_2$ are determined by applying the following critical conditions to the general solution of the formula (4).

$$D[(d/dz)\Delta p(z)]_{z=0} = S_0 \Delta p(0) \quad (7)$$

$$-D[(d/dz)\Delta p(z)]_{z=W} = S_W \Delta p(W) \quad (8)$$

$S_0$: surface recombination rate on the main surface receiving light emission $S_W$: surface recombination rate on the reverse side of the main surface $2b$ The results are:

$$K_1 = -CK_a/K_0 \quad (9)$$

$$K_2 = CK_b/K_0 \quad (10)$$

$$K_a = (S_0 + M_1)(S_W + M_2)E_{1+} - (S_0 - M_2)(S_W - M_1)E_{2-} \quad (11)$$

$$K_b = (S_0 + M_1)(S_W - M_2)E_{1-} - (S_0 + M_2)(S_W - M_1)E_{2-} \quad (12)$$

$$K_0 = (S_0 + M_2)(S_W + M_2)E_{1+} - (S_0 - M_2)(S_W - M_2)E_{1-} \quad (13)$$

$$M_1 = \alpha D \quad (14)$$

$$M_2 = D/l_D \quad (15)$$

$$E_{1+} = (E_{1-})^{-1} = \exp(W/l_D) \quad (16)$$

$$E_{2-} = \exp(-\alpha W) \quad (17)$$

Average number of excess carriers per unit value is given by $$\Delta P = (1/W) W_0 \int_0^W \Delta p(z) dz \quad (18)$$

When ion injection to the upper side of the main surface $2a$ is conducted, the surface recombination rate $S_0$ in the vicinity of the main surface $2a$ varies with the dose quantity. Therefore, the number of excess carriers $\Delta p$ is varied therewith, and the variation is detected as variation of absorption amount or reflection amount of electromagnetic wave.

On the other hand, in the apparatus 1 of FIG. 1, the wafer 2 is moved relative to the measuring device, so that the relative distance between the microwave generator 5 and wafer 2 varies minutely and the impedance of the wafer 2 as a tested system is also subjected to variation. The detection conditions in the microwave detector varies too. Accordingly, taking as R the variation amount of microwave reflection from the time when light emission was not conducted, the relation of the number of excess carriers $\Delta p$ and reflection variation amount R can be given as the formula below, if the error elements, such as the relation of geometrical position between the measuring device and the wafer 2 is conceptionally expressed with a parameter $a$.

$$R = F(\Delta P, a) \quad (19)$$

However, it is not necessary to specify the function F concretely, but function F is derived in order to show that the amount R depends not only on $\Delta P$ but also on the parameter $a$.

In the conventional technique, the surface state of wafer 2 has been inspected by the variation amount of reflection without eliminating the error due to the parameter $a$, thereby causing the problems already discussed. In the invention, the effect of the parameter $a$ is removed according to the principle described below.

Figure 3B:
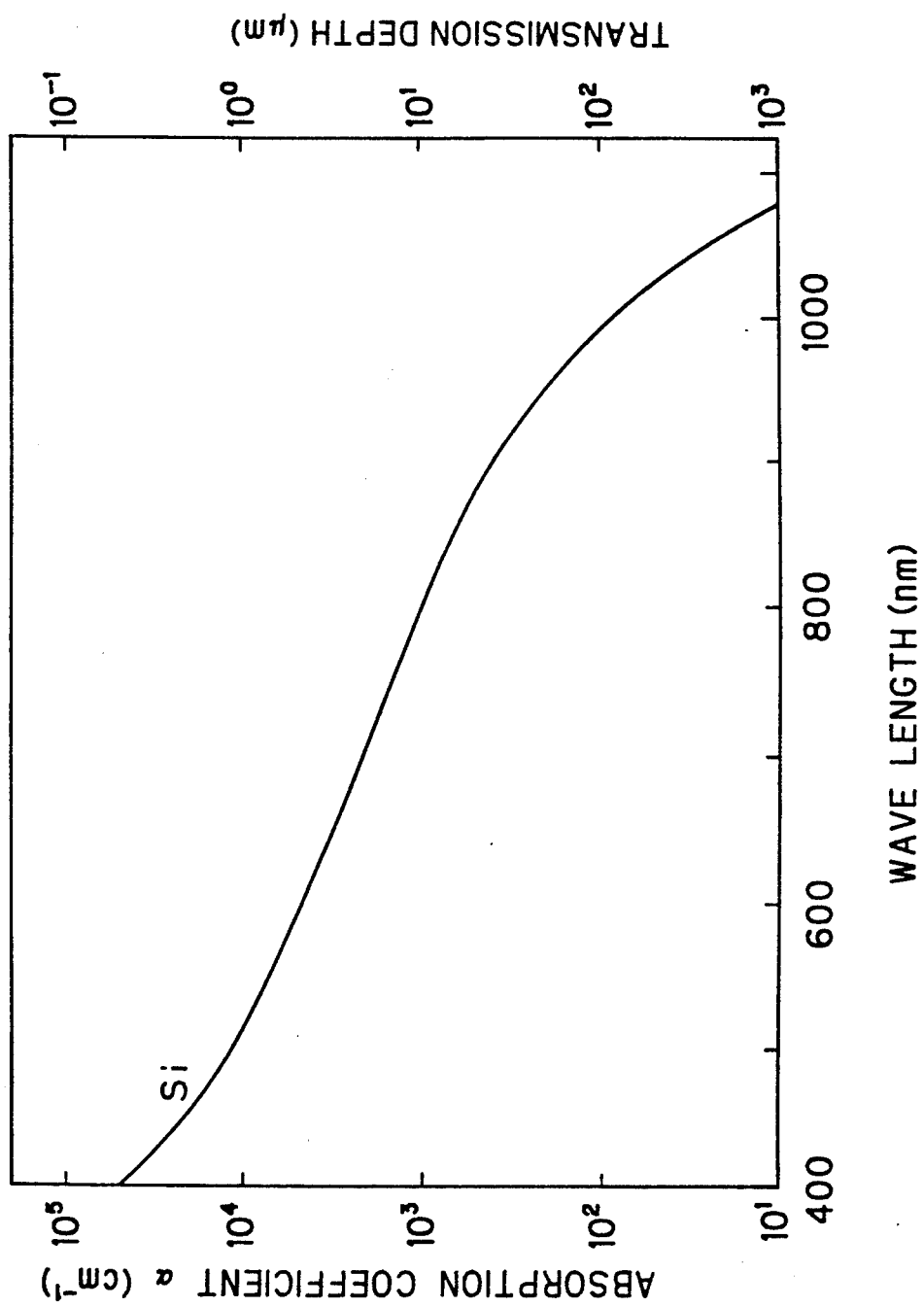
FIG. 3B is a graph showing dependency of absorption coefficient and transmission depth to wave length of incident light.

First, the number of excess carriers $\Delta P$ include various constants as shown by the formulas (4) to (18), and among which, the constants such as $\alpha$, $q$, $R_s$, have dependency on the wave length of emitted light. Especially, the absorption coefficient $\alpha$ has a large dependency to wave length (refer to FIG. 3B). Therefore, the number of excess carriers $\Delta P$ depends on the wave length of emitted light $\lambda$, and hereinafter, it is expressed as $\Delta P(\lambda)$ to show the state. Then, the formula (19) is expressed as below.

$$R(\lambda) = F(\Delta P(\lambda), a) \quad (20)$$

where, $R(\lambda)$ is a variation amount of microwave reflection to an incident light having wave length $\lambda$.

When two wave lengths different from each other are expressed as $\lambda_1$, $\lambda_2$ and the respective illumination intensity on the main surface of the wafer 2 are expressed as $I_{01}$, $I_{02}$, the normalized finite differences $\Delta R_N \{\lambda_1, \lambda_2\}$ between a variation amount of reflection R ($\lambda_1$) obtained by determination under irradiation with light having wave length $\lambda_1$ and the variation amount of reflection R ($\lambda_2$) obtained under irradiation with light of wave length $\lambda_2$ are given by the following formula.

$$\Delta R_N (\lambda_1, \lambda_2) = R(\lambda_1)/I_{01} - R(\lambda_2)/I_{02} \quad (21)$$
$$= F(\Delta P(\lambda_1), a)/I_{01} - F(\Delta P(\lambda_2), a)/I_{02}$$

Herein, the function f is defined as below.

if, $$f(\lambda_1) = F(\Delta P(\lambda_1), 0)/I_{01} \quad (22a)$$

$$f(\lambda_2) = F(\Delta P(\lambda_2), 0)/I_{02} \quad (22b)$$

The function F can be rewritten in the following form, whereby a function T is derived.

$$F(\Delta P(\lambda_1), a) = I_{01} f(\lambda_1) + I_{01} T(\lambda_1, a) \quad (23a)$$

$$F(\Delta P(\lambda_2), a) = I_{02} f(\lambda_2) + I_{02} T(\lambda_2, a) \quad (23b)$$

assigning the formulas (23a), (23b) to the formula (21):

$$\Delta R_N(\lambda_1, \lambda_2) = \Delta f + \Delta T \quad (24)$$

$$\Delta f = f(\lambda_1) - f(\lambda_2) \quad (25)$$

$$\Delta T = T(\lambda_1, a) - T(\lambda_2, a) \quad (26)$$

and, from the formulas (22a), (22b), (23a), (23b), the following formula is obtained.

$$T(\lambda_1, 0) = T(\lambda_2, 0) = 0 \quad (27)$$

In the formula (24), in order to strictly examine the relationship of magnitudes of $\Delta f$ and $\Delta T$, it is required to conduct further theoretical analysis corresponding to the situation. Herein, however, the following relation is given, assuming that the second term of the right side of the formula (24) can be neglected in relation to the first term thereof.

$$\Delta f >> \Delta T \quad (28)$$

If this assumption is correct, it is concluded that the normalized finite difference $\Delta R_N$ does not depend on the error parameter a. The rationale of this assumption can be confirmed by determining the normalized finite difference $\Delta R_N$ thereby examining whether or not more precise evaluation results are obtained than that obtained hereto.

While an example for the determination will be described below, it has been already confirmed that the above assumption is reasonable. The above mentioned normalized finite difference $\Delta R_N$ can be referred to as DN-SRMI (Difference of Normalized S-Related Microwave Intensity).

Qualitatively, the depth of light transmission varies if the wave length thereof is different, and the variation amounts of microwave reflection respectively corresponding to light wave lengths $\lambda_1$, $\lambda_2$ becomes different from each other. However, because the variation of reflection caused by variation of geometrical arrangement is approximately common relative to each of the wave lengths, the variation can be cancelled by conducting finite difference calculation.

It is apparent that the wave lengths $\lambda_1 = 950$ nm, $\lambda_2 = 633$ nm correspond to energy higher than the critical energy for generating electron-hole pairs. Further, the pulse width, with which these are emitted as pulse light, is sufficiently larger than the life time of (<2-3 ms) carriers on the surface of silicon substrate.

C. Details of Operations

The operation, processes and details of the action of the apparatus shown in FIG. 1 will be described below. The sequence of action is shown in FIG. 4.

At the step S1 of FIG. 4, light ($\lambda_1 = 950$ nm) from the LED 11 is applied to the wafer stage 3 to measure the intensity of illumination $I_{01}$ at a position at which the wafer is to be held. The measurement is conducted using an illuminometer or the like. Next, the LED 11 is switched off and laser light ($\lambda_2 = 633$ nm) is applied from the He-Ne laser generator 7 to the stage 3 to measure the intensity of illumination $I_{02}$. These values of illumination intensity $I_{01}$, $I_{02}$ are stored in the main computer 14 via the input/output device 17. Then, the Ne-Ne laser generator is switched off.

At the step S2, the wafer 2 to be inspected is set on the stage 3. By operation of a start switch (not shown), the wafer stage 3 is moved two dimensionally and intermittently and microwaves are applied from the microwave generator 5 to the wafer 2. At each position in the intermittent movement of the stage 3, the first pulse light L1 is applied to the wafer 2 and a reflected microwave detection signal V is sent to the lock-in amplifier 13 where a data output value $V_1$ is obtained by detecting the peak value or effective value thereof.

A waveform diagram at this step is shown in FIG. 5A, wherein the peak value of signal V is shown as $V_1$. By using such a lock-in amplifier 13, S/N ratio in obtaining the data $V_1$ can be improved. When the data $V_1$ has been detected, LED 11 is switched off, the shutter 9 is moved back to the position of solid line and pulse light $L_2$ is applied to the wafer 2. Then, an output signal from the microwave detector 6 is applied to the lock-in amplifier 13 from which the peak value or effective value thereof $V_2$ is supplied to the main computer 14 (FIG. 5B). Then, the shutter 9 is moved forward to the position of dashed lines.

This operation is repeated every time the stage 3 is moved intermittently. Thereby, when the scanning with reference to the main surface 2a of wafer 2 is completed, a pair of data values $V_1$, $V_2$ is obtained at each of the lattice points $P_{ij}$ (i = 1−m, j = 1−n) (step S3 in FIG. 4).

By conducting phase detection and smoothing in the lock-in amplifier 13 based on the reflection level during the period that light is not applied, the data values $V_1$, $V_2$ express the variation in the amount of microwave reflection based on the non-light application period.

In the CPU 15, the respective normalized finite differences as shown by the formula (29) are calculated based on the data value $V_1$, $V_2$ at each lattice point $P_{ij}$ (step S4)

$$\Delta V_N = V_1 / I_{01} - V_2 / I_{02} \quad (29)$$

Since the data values $V_1$, $V_2$ indicate the variation amount of microwave reflection in the formula (21), R ($\lambda_1$), R ($\lambda_2$), normalized finite difference $\Delta V_N$ corresponds to the normalized finite difference $\Delta R_N$. By plotting the normalized finite difference $\Delta V_N$ relative to each of the lattice points $P_{ij}$, the electronic state of the wafer surface such as ion dose amount can be inspected. When the electronic state of each wafer surface before ion injection is not so varied, the normalized finite difference of the reflection itself may be measured instead of the variation amount of microwave reflection. In this case, although the value of normalized finite difference deviated from that of the formula (21), the deviation is cancelled when the difference is calculated and therefore gives no significant effect thereto.

Figure 6:
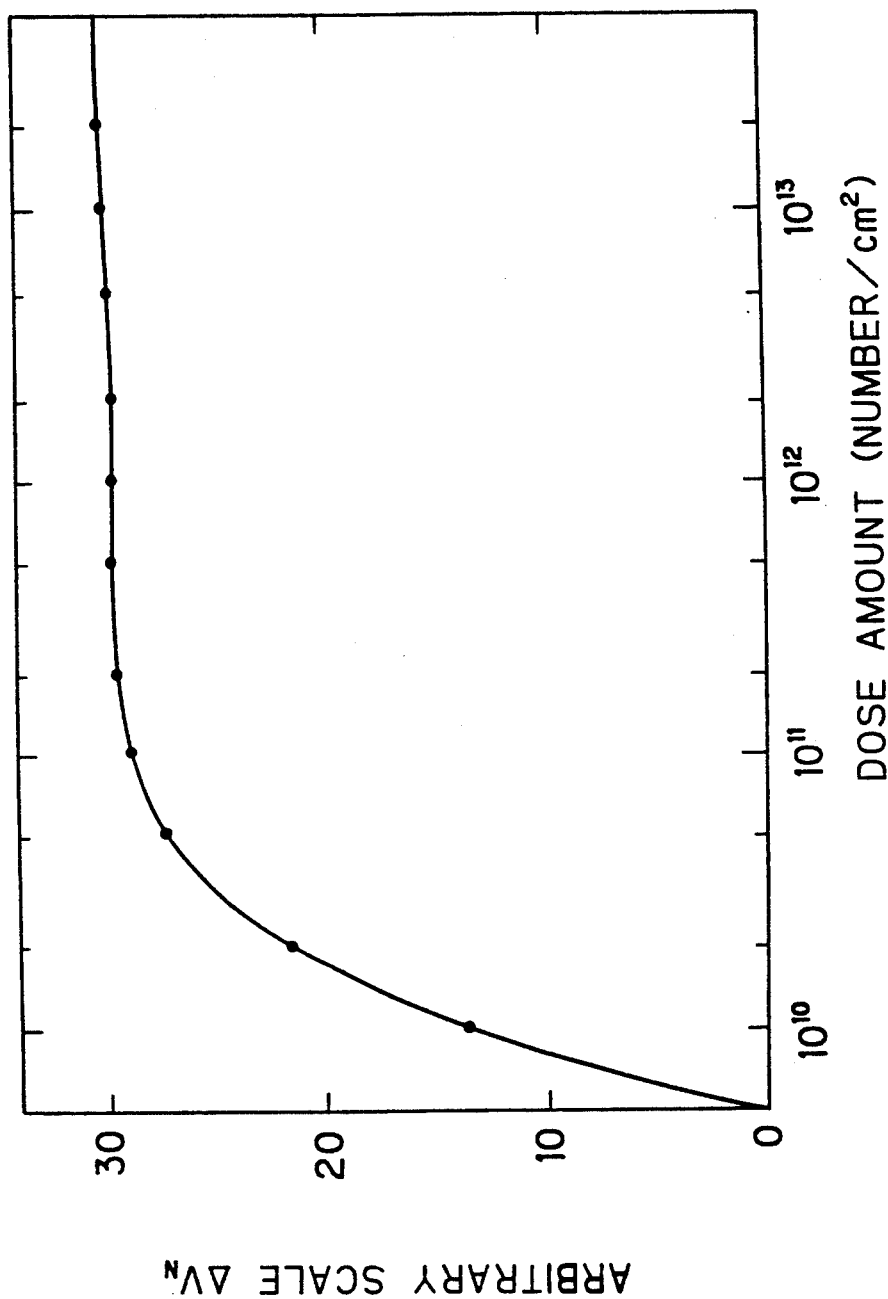
FIG. 6 is a graph showing the relation between amount of ion dose to a wafer and normalized finite difference value.

The relationship between the value $\Delta V_N$ and dose amount can be previously determined by experiment or simulation. FIG. 6 is a graph experimentally obtained to show the relation between dose amount and normalized finite difference $\Delta V_N$ when B+ ion is injected at 100 KeV to the surface (100) of P-Si. As apparent from the graph, for dose amounts lower than $10^{11}/cm^2$, the normalized finite difference $\Delta V_N$ becomes acutely affected and the dose amount can be exactly estimated from the value of normalized finite difference $\Delta V_N$.

D. Data and Calculated Results

Figure 7:
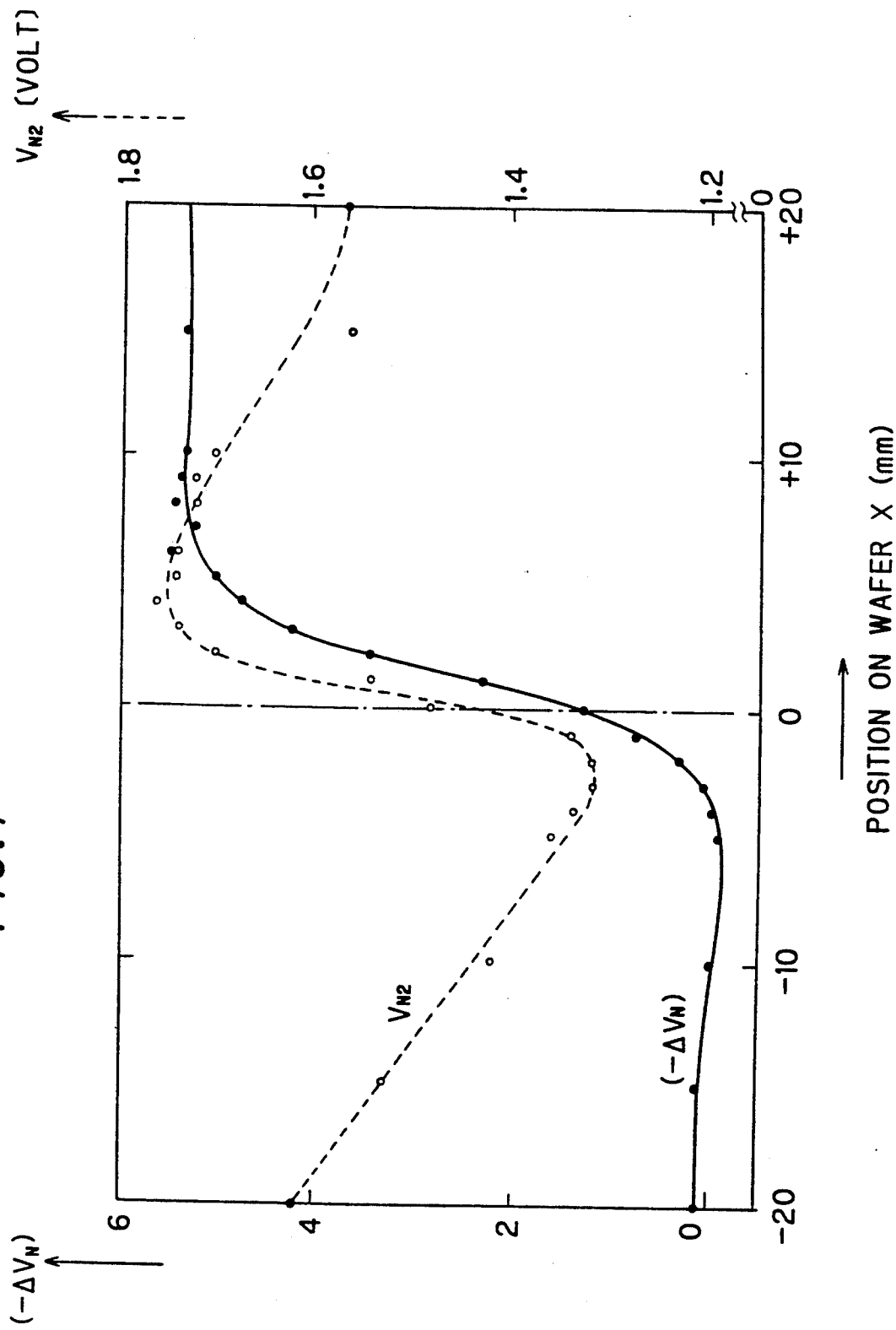
FIG. 7 is a graph showing results of measurement with reference to a wafer specimen.
Figure 8:
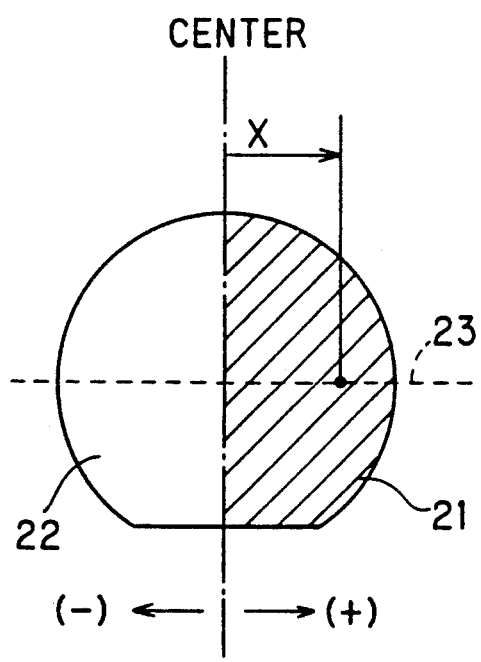
FIG. 8 is a plan view of a sample wafer used in the measurement of FIG. 7, FIGS. 9 to 11 are graphs showing the relation between rate of surface recombination and number of excess carriers on the light emitted sides of the main surface.

FIG. 7 is a graph showing the result of measurement of normalized finite difference $\Delta V_N$ with reference to a wafer sample using the apparatus of FIG. 1. The wafer sample was prepared by forming an oxidized silicon film of 500 Å in thickness on the main surface (111) and injecting P+ ion only in the right half area 21, as shown in FIG. 8, with density of $1 \times 10^{12} cm^{-2}$ at 100 KeV and annealing the whole wafer. Accordingly, the right half area 21 (area of X > 0) has a surface recombination rate smaller than that of the left half area 22. In FIG. 7, the solid lines show normalized finite difference $\Delta V_N$ obtained by the apparatus of FIG. 1 with an arbitrary scale, the dashed lines show normalized finite difference value $VN_2$ ($=V_2/I_{02}$) of data $V_2$ corresponding to the pulse light L2. $\Delta V_N$ and $V_{N2}$ are measured along the scanning line 23 (FIG. 8).

As indicated in FIG. 7, both $V_{N2}$ and $\Delta V_N$ show a stepwise variation according to the difference of the surface recombination rate in the area 21 where ion injection was conducted and that in the area where no ion injection was conducted, while the graph of $V_{N2}$ shows a significant inclination of the base line in each of the areas 21 and 22. The inclination of the base line is so large at the points of $X = +20$ mm and $-20$ that the levels thereof are reversed.

By contrast, the normalized finite differences $\Delta V_N$ measured by the apparatus 1 of the example form an approximately flat base line. Therefore, it is exactly indicated that the dose amount is zero in the area 22, and that the density in the area 21 is uniform and limited. Thus it is appreciated that the assumed formula (28) as above described is reasonable and the apparatus 1 provides an excellent evaluation result.

Figure 9:
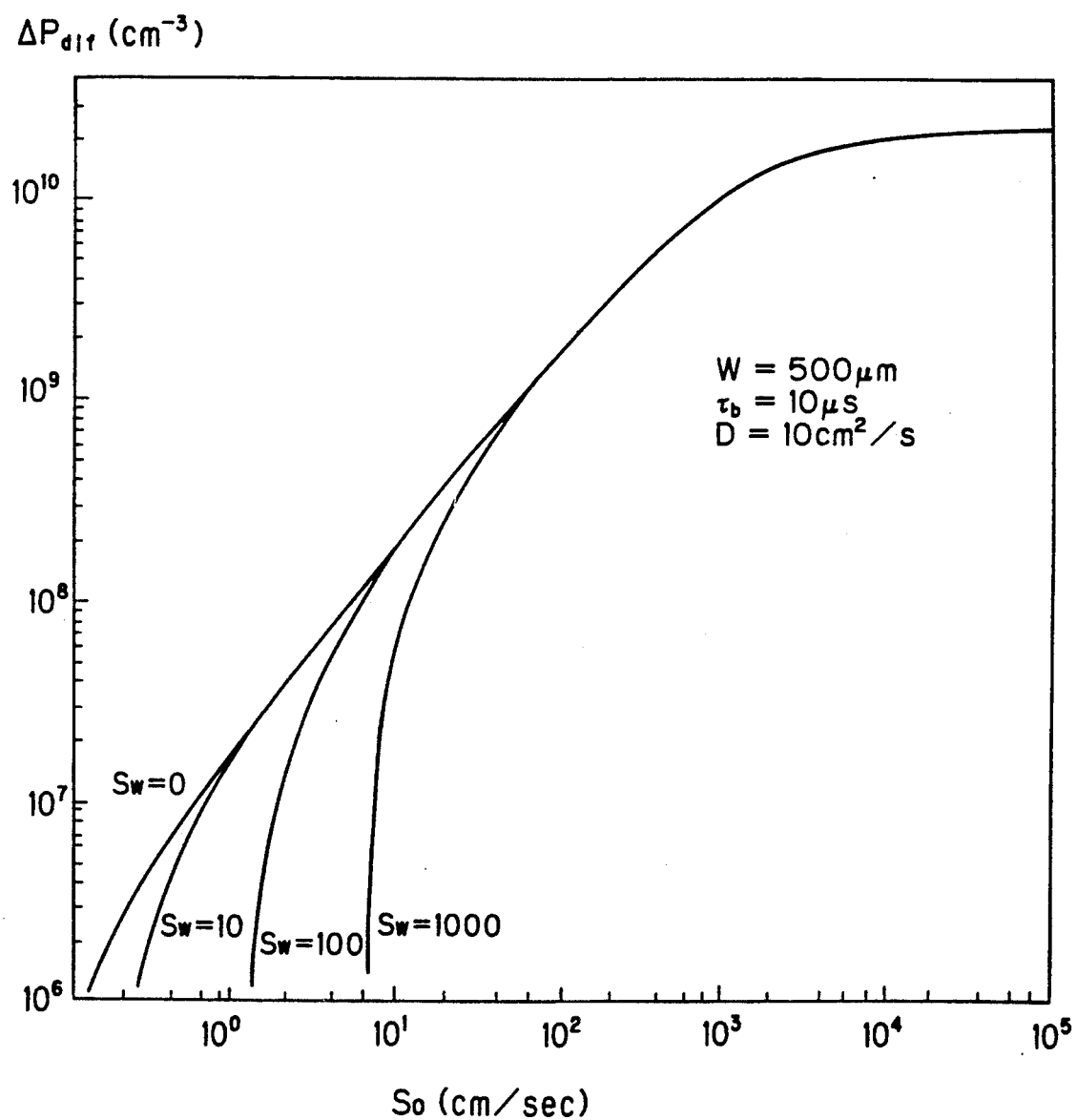

FIG. 9 is a graph obtained by numerical calculation relating to the dependency of normalized finite difference of the numbers of excess carriers $\Delta P(\lambda_1)$, $\Delta P(\lambda_2)$ each using light of wave lengths $\lambda_1$, $\lambda_2$ upon the surface recombination rate $S_0$ on the main surface 2a;

$$\Delta P_{dif} = \Delta P(\lambda_1)/I_{01} - \Delta P(\lambda_2)/I_{02} \tag{30}$$

wherein, formulas (4)-(18) are used as the calculation formula of $\Delta P(\lambda_1)$, $\Delta P(\lambda_2)$. From this graph, it is shown that, in the surface recombination rate $S_0$ ranging $10-10^3$ cm/sec, the value of $\Delta P_{dif}$ is varied readily responding to the variation of the value $S_0$. Since the value of $S_0$ has a value corresponding to the amount of ion dose, and the value of $\Delta P_{dif}$ corresponds to the normalized finite difference of the level of microwave reflection shown by the formulas (21) to (29), it is appreciated that the amount of ion dose can be determined minutely in the range of $10 < S_0 < 10^3$ cm/sec with use of the apparatus of this example.

This fact agrees with the observed data shown in FIG. 6. In a wafer 2 practically used, the value of $S_0$ scarcely exceeds a value of $10^3$ cm/sec, and it is understood that the apparatus 1 affords high usability in practice.

Figure 10:
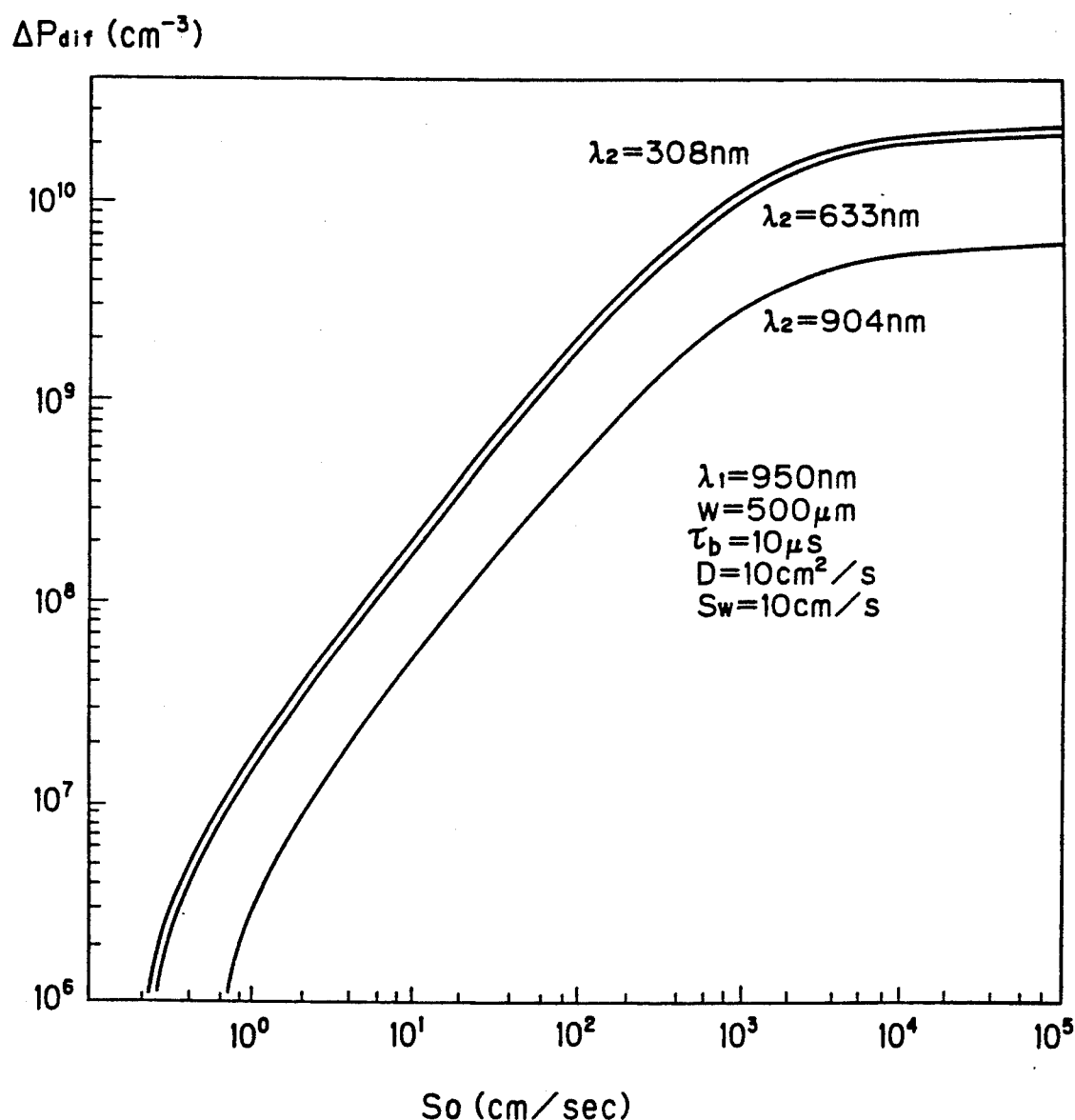

Next, the wave length of light used in the invention will be discussed. FIG. 10 is a graph, which shows the state of variation of the relation between the values of $S_0$ and $\Delta P_{dif}$ according to the value of wave length $\lambda_2$, when the wave length $\lambda_1$ is 950 nm. This graph is obtained also by numerical calculation using the formulas (4)-(18) and (30). As apparent from FIG. 10, because the detectable range can be hardly extended, even if a value of wave length shorter than 633 nm (He-Ne laser), as used in this example, is used, it is understood that a He-Ne laser provides acceptable results, particularly from a cost performance stand point.

Figure 11:
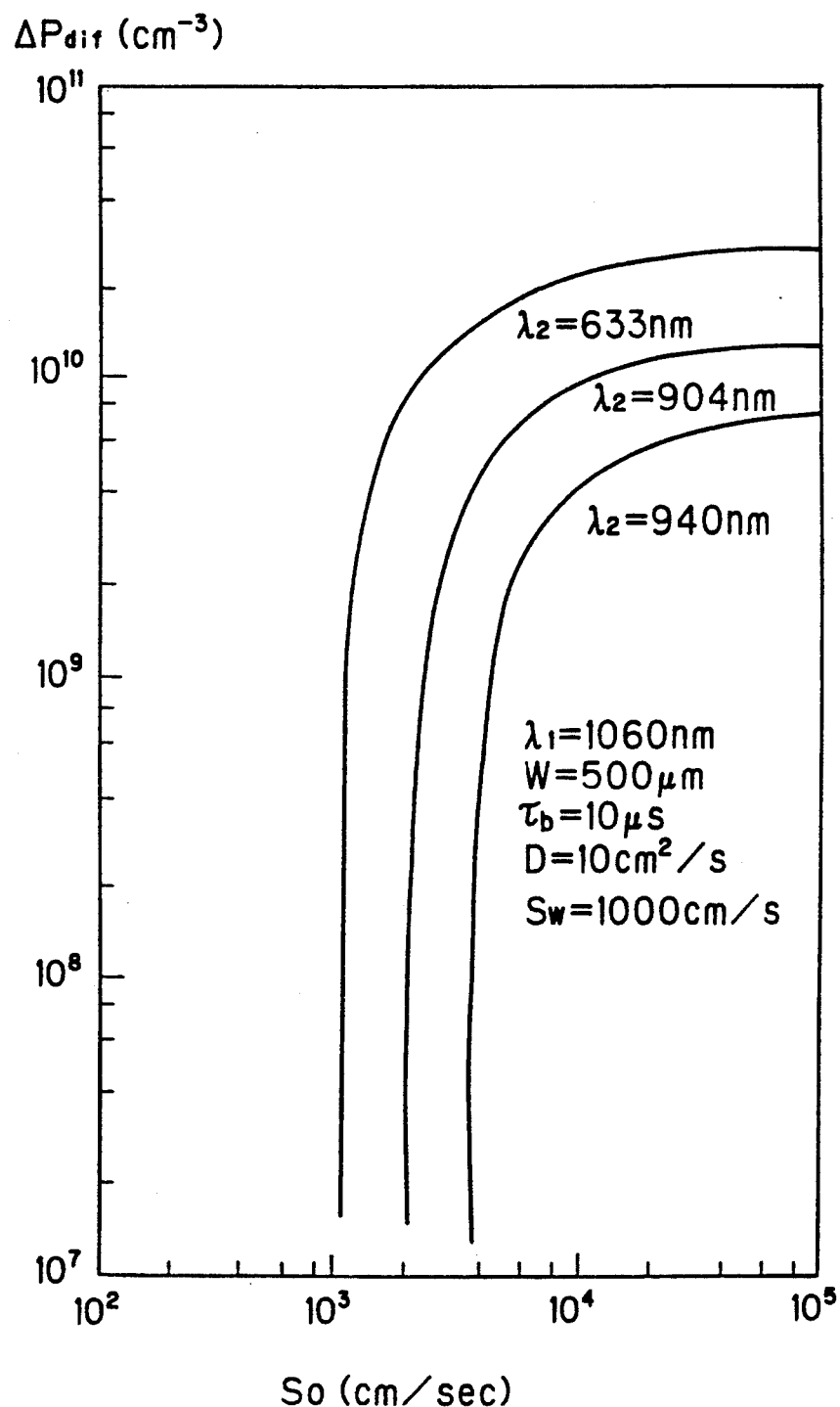

FIG. 11 shows the result obtained by a similar numerical calculation as conducted in FIG. 10, setting the wave length $\lambda_1$ as 1060 nm (YAG laser). Comparing FIG. 11 with FIG. 10, it is shown that the detectable range is narrowed when a YAG laser is used in the case where a LED of wave length $\lambda_1 = 950$ nm is used. Therefore, in the apparatus 1 of the example, the selection of $\lambda_1 = 950$ nm, $\lambda_2 = 633$ nm is practically the best, since the better result is not always obtained even if the difference of wave length $\lambda_1$, $\lambda_2$ are enlarged to increase the difference of permeation depth of the respective light sources.

E. Selection of Finite Difference-Type Function

As described above, by obtaining microwave detection levels $V_1$, $V_2$ corresponding to wave length $\lambda_1$, $\lambda_2$ the electronic state of the wafer surface 2a can be evaluated precisely. However, in general, it is possible to inspect the electronic state of wafer surface 2a by measuring a quantity other than the above mentioned normalized finite difference. Namely, the inspection may be conducted by making a specified transform function $H(V_N)$, which includes microwave detection level $V_N$ as a variable, and determining the difference obtained by assigning $V_{N1} = V_1/I_{01}$, $V_{N2} = V_2/I_{02}$ thereto:

$$\Delta H = H(V_{N1}) - H(V_{N2}) \tag{31}$$

The normalized finite difference $\Delta V_N$ defined in the formula (29) corresponds to a stationary function:

$$H(V_N) = V_N \tag{32}$$

Other than the formula (32), power or root of $V_N$, polynomial formula of $V_N$ are given as examples of transform function $H(V_N)$. That is, the function $H(V_N)$ may be:

$$H(V_N) = V_N^n \tag{32a}$$

or $$H(V_N) = \Sigma a_i V_N^{n_i} \tag{32b}$$

where:
n and $n_i$ are real numbers;
$a_i$ is a coefficient; and
$\Sigma$ represents a sum for the number i.
When a logarithmic function such as $$H(V_N) = \log V_N \tag{33}$$

is used, operation is conducted by dividing $V_{N1}$ by $V_{N2}$ because $\Delta H$ is given as $$\Delta H = \log V_{N1} - \log V_{N2} = \log(V_{N1}/V_{N2}) \tag{34}$$

Figure 12:
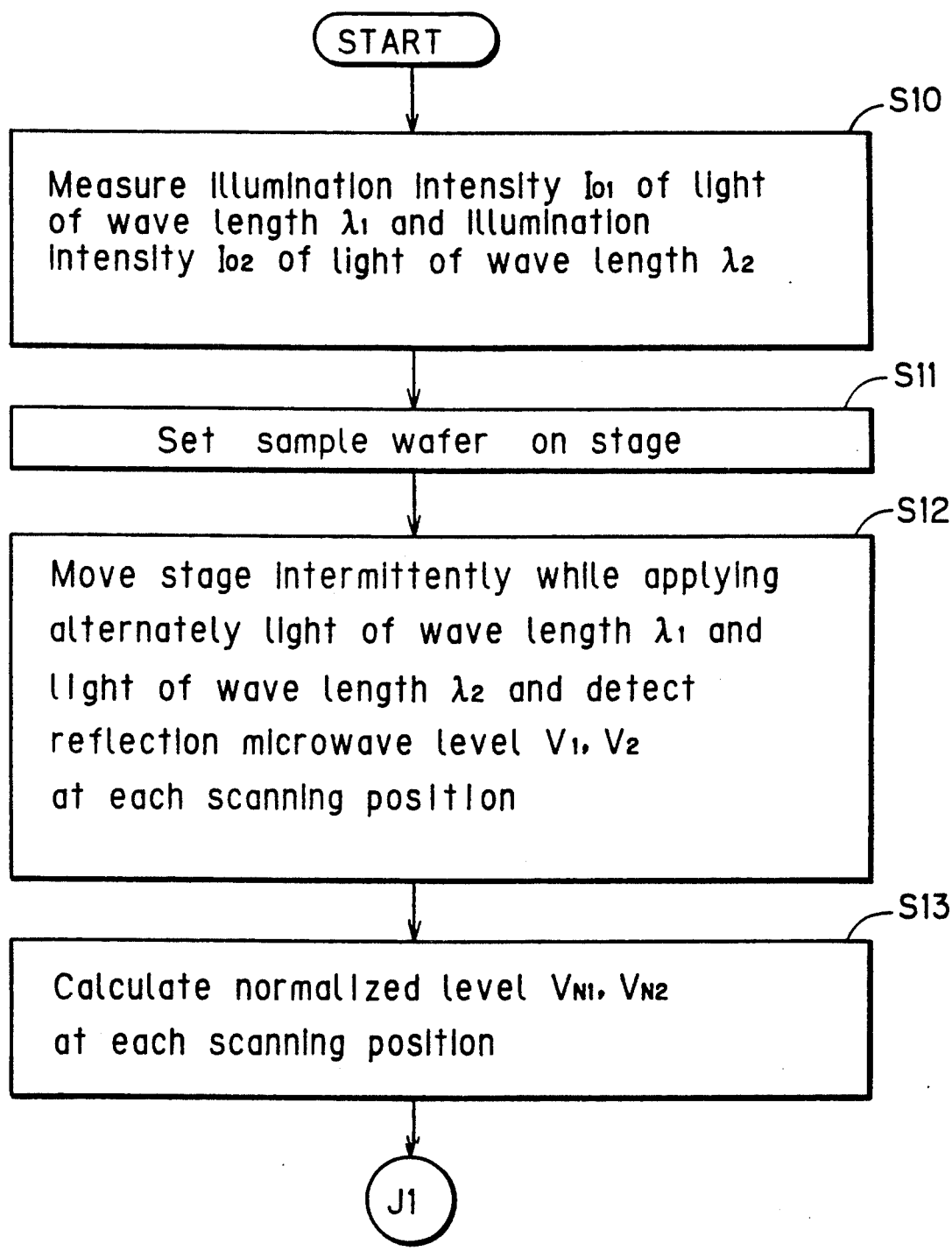
FIG. 12 is a flow chart showing selection process of finite difference-type function.
Figure 12:
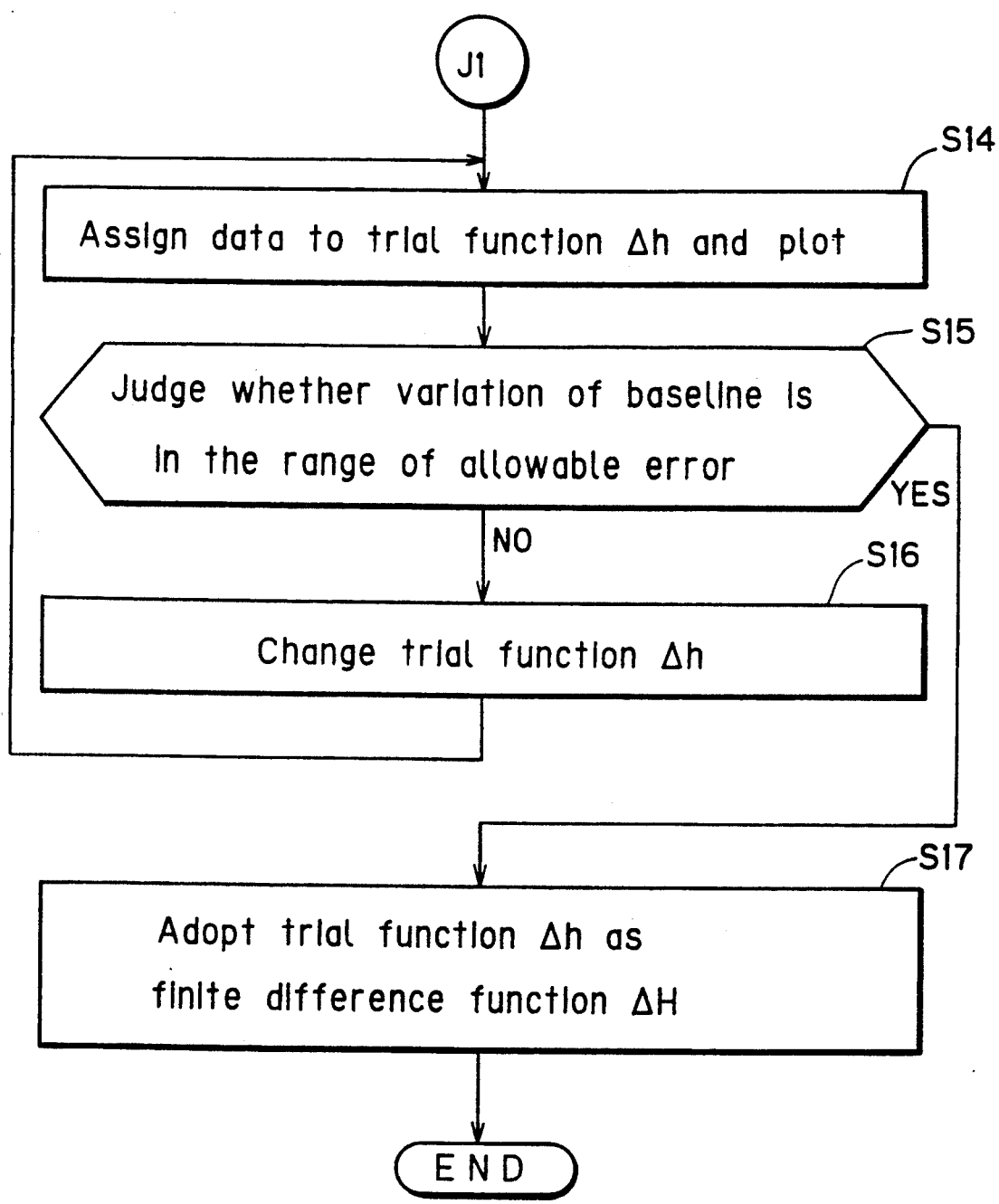

As above mentioned, there are various kind of finite difference-type functions. In order to select the most adequate function corresponding to the case, a process shown in FIG. 12 is conducted as follows.

First, at step S10, measurement of illumination intensity is conducted in the same way as step S1 of FIG. 4. At the next step S11, a sample wafer having a uniform surface state (for example, uniformly doped with ions) on at least a part of the main surface thereof is set on the stage 3. Next steps, S12, S13, are the same as the steps, S3, S4 of FIG. 4, and normalized levels $V_{N1}$, $V_{N2}$ are determined at each scanning position.

Next, a previously selected finite difference-type function:

$$\Delta h = h(V_{N1}) - h(V_{N2}) \tag{35}$$

is made as a trial function, and assigned the values $V_{N1}$, $V_{N2}$ at each scanning position to the function to plot the results relative to each scanning position (step 14). If the result of this plotting is that shown by dashed lines of FIG. 13, variation depth $d_1$ of the base line thereof is determined at the step S15, and the value found is compared with a specified allowable error. If the variation depth $d_1$ is larger than the allowable error, the steps, S14 and S15, are repeated with use of a new trial function which is obtained by transforming the function form of the transform function h included in the finite difference function $\Delta h$ (step S16).

Figure 13:
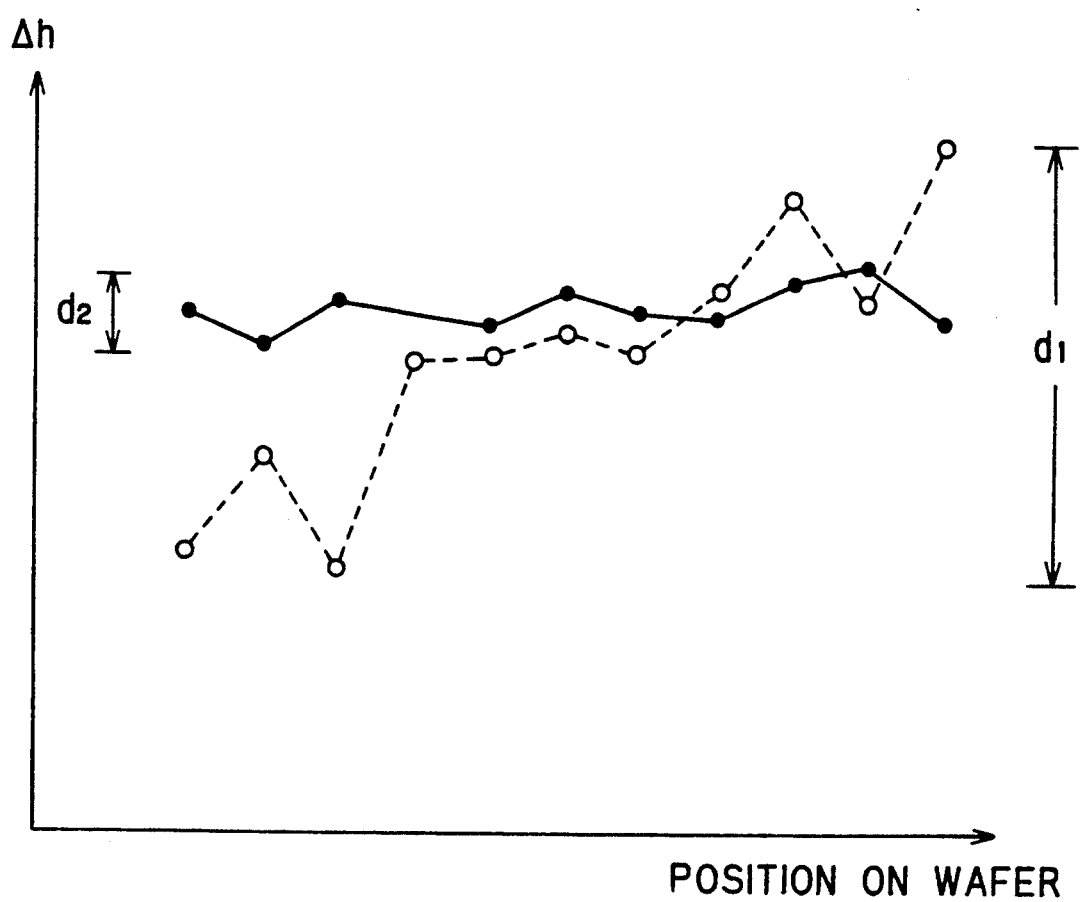
FIG. 13 is a graph showing result of plotting in selection process of finite difference type function.

If the result of plotting with reference to the newly used trial function is that shown by solid line of FIG. 13, and the variation depth $d_2$ is within the allowable error, the trial function is adopted as the finite difference-type function H (step S17). Thus, in this process, a trial function which gives distribution width of the function values smaller than a specified distribution width is adopted as the finite difference-type function $\Delta H$. As the distribution width, a statistical quantity such as dispersion may be used in place of the above example.

The function form thus adopted is set in the main computer 14, and the process of FIG. 4 is conducted using this function with reference to the wafer 2 being inspected. In this manner, a pertinent finite difference type function can be selected corresponding to materials of semiconductor to be inspected or kind of the measuring apparatus to be used. The formula (29) used in the example selected from this view point.

F. Modified Examples and Application Examples (1) The inspection can be conducted by applying more than three kinds of light having wave lengths different from each other, detecting the respective levels of microwave reflection and determining the respective finite differences. Since the transmission depths are varied according to the respective wave lengths, inspection can be conducted with reference to regions having different depths from the main surface 2a by this process.

(2) the light applied to the wafer may be continuous light instead of pulsed light. However pulsed light is preferred to prevent a rise of temperature of the wafer due to the incident light. As the first wave length $\lambda_1$, that ranging from 900 to 1050 nm is preferred, and as the second wave length $\lambda_2$, that ranging from 400 to 700 nm is preferable. The optimum wave lengths are $\lambda_1 = 950$ nm, $\lambda_2 = 633$ as shown in the above example.

(3) As the light source, in place of those having single wave length such as laser light, white light may be used combination with a filter. An interference filter or spectroscope can be used as the filter.

(4) This invention can be applied to inspect the electronic state of the surface of a semiconductor substrate under any condition which affects the surface recombination rate of the carrier. The main examples of the inspection are listed below.

(a) analysis of impurity ion injection, diffusion, gettering etc.

(b) analysis of crystallinity or lattice defects of substrate surface.

(c) analysis of the state of interface between substrate and film formed thereon such as insulation film of $SiO_2$, $Si_2N_3$, photoresist film and the like.

(d) analysis of the state of etching on the surface of substrate.

(5) In the invention, the term "semiconductor substrate" includes not only the substrate itself but also those having the main surface on which various kind of film is formed or to which various treatment is applied.

It is preferable to conduct the scanning by alternately generating the first light and the second light. However, the scanning may be conducted on all parts of the substrate with one light and then with the other light.

(6) When microwave is applied to the substrate, a part thereof is transmitted to the reverse side. The second electromagnetic wave partly generated in the substrate is also partly transmitted to the reverse side. Accordingly, the invention can be applied by arranging the microwave detector on the reverse side of the substrate and detecting the transmission level of the microwave (including the second electromagnetic wave). In this case, a stage may be used stage having a window to allow the transmitted electromagnetic wave to pass through, or a stage made of a material having small reflectivity or absorbability of said transmitted wave, as the stage 3. The principle that the level of the transmitted wave varies with the surface state or wave length of light is similar to that in the reflection measurement.

As described above, by the method according to the invention, the inspection of the electronic state of the substrate surface can be conducted with high precision even if the measuring conditions such as geometrical relation of measurement apparatus and substrate are varied, because the error caused by such variation can be compensated by assigning the data of the first and the second levels to a finite difference-type function.

Moreover, the above effect is further improved by selecting a pertinent type of function as the finite difference-type function.

Further, the apparatus according to the invention which has a constitution suitable for practicing the above methods, is usable to obtain the above mentioned effects.

Although the present invention has been described and illustrated in detail, it is understood that the same is by way of illustration and example only and is not to be taken by way of limitation. The scope of the invention should be limited only by the terms of the appended claims.

What is claimed is:

1. A device for inspecting an electronic state of a surface of a semiconductor substrate, comprising:

(a) electromagnetic wave emitting means for emitting a first electromagnetic wave to a surface of said semiconductor substrate, wherein said first electromagnetic wave has an energy smaller than a minimum energy required for generating an electron-hole pair in said semiconductor substrate;

(b) first light emitting means for emitting a first light to said surface of said semiconductor substrate, wherein said first light has a first wave length and an energy larger than said minimum energy;

(c) second light emitting means for emitting a second light to said surface of said semiconductor substrate, wherein said second light has a second wave length and an energy larger than said minimum energy and wherein said second wave length is different from said first wavelength;

(d) light selecting means for alternately selecting one of said first and second lights and leading a selected light to a surface of said semiconductor substrate;

(e) electromagnetic wave detecting means for detecting a second electromagnetic wave which is emitted from said semiconductor substrate in response to said first electromagnetic wave when said surface is exposed to said selected light and for generating an electric signal representing an intensity of said second electromagnetic wave;

(f) data generating means for generating first and second data values representing said electric signal in first and second time periods during which said first and second lights are selected by said light selecting means, respectively; and (g) calculator means for substituting said first and second data values for variables included in a predetermined finite difference-type function to thereby obtain a function value which is employable in inspecting an electronic state of said surface of said semiconductor substrate.

2. The device of claim 1, wherein:
said data generating means comprises;
(f-1) a lock-in amplifier which is synchronized with a selection timing in said light selecting means to detect respective levels of said electric signal in said first and second time periods.

3. The device of claim 1, wherein:
said calculating means comprises:
(g-1) means for calculating said function having a form of:

$$\Delta H = H(V_1/I_{01}) - H(V_2/I_{02})$$

where:
H(x) is a transform function of x;
x is $V_1/I_{01}$ or $V_2/I_{02}$;
$I_{01}$ is illuminance of said first light on said surface;
$I_{02}$ is illuminance of said second light on said surface;
$V_1$ is said first data value; and
$V_2$ is said second data value.

4. The device of claim 3, wherein:
said transform function has a form of:

$$H(x) = x^n$$

where:
n is a real number.

5. The device of claim 3, wherein:
said transform function has a form of a polynominal:

$$H(x) = \sum_i a_i x^{n_i}$$

where:
$n_i$ is a real number; and
$a_i$ is a coefficient.

6. The device of claim 3, wherein:
said transform function is a logarithm function.

7. The device of claim 1, wherein:
said light selecting means comprises;
(e-1) a dichroic mirror whose surface reflects said second light and transmits said first light.

8. The device of claim 1, wherein:
said first electromagnetic wave is a microwave.

9. A method of inspecting an electronic state of a surface of a semiconductor substrate, comprising the steps of:

(a) emitting a first electromagnetic wave and a first light to a surface of said semiconductor substrate at a first time period;

(b) emitting said first electromagnetic wave and a second light to a surface of said semiconductor substrate at a second time period;

(c) detecting a second electromagnetic wave which is emitted from said semiconductor substrate in response to said first electromagnetic wave in said first and second time periods to thereby obtain:
a first data value representing an intensity of said second electromagnetic wave in said first time period, and
a second data value representing an intensity of said second electromagnetic wave in said second time period, (d) substituting said first and second data values for variables included in a predetermined finite difference-type function to thereby obtain a function value; and (e) inspecting an electronic state of said surface of said semiconductor substrate on the basis of said function value;

wherein:
said first electromagnetic wave has an energy smaller than a minimum energy required for generating an electron-hole pair in said semiconductor substrate;
said first light has a first wave length and an energy larger than said minimum energy; and
said second light has a second wave length and an energy larger than said minimum energy and wherein said second wave length is different from said first wavelength.

10. The method of claim 9, further comprising the steps of:

(f) preparing a semiconductor sample substrate having a surface, said surface having at least part of which electronic state is uniform;

(g) conducting the steps (a) through (c) for said semiconductor sample substrate while scanning a surface of said semiconductor sample substrate to thereby obtain said first and second data values for said semiconductor sample substrate;

(h) providing said first and second data values for said semiconductor sample substrate to variables of one kind of finite difference-type function for each scanning position on said surface of said semiconductor sample substrate to thereby obtain a distribution of function values;

(i) comparing the range of said distribution with a predetermined threshold value;

(j) repeating steps (f) through (i) while changing said kind of function until one kind of function providing a value of said range of distribution smaller than said threshold value is obtained; and (k) defining said finite difference-type function by said one kind of function;

wherein said finite difference-type function defined in the step (k) is employed in the step (d) for said semiconductor substrate.

11. The method of claim 9, wherein:
said first light has a wave length in 900–1050 nm; and
said second light has a wave length in 400–700 nm.

12. The method of claim 9, wherein:
said first light and said second light are continuous light.

* * * * *